United States Patent
Koga

(10) Patent No.: US 7,315,348 B2
(45) Date of Patent: Jan. 1, 2008

(54) EXPOSURE APPARATUS, FOCAL POINT DETECTING METHOD, EXPOSURE METHOD AND DEVICE MANUFACTURING METHOD

(75) Inventor: Shinichiro Koga, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 165 days.

(21) Appl. No.: 11/110,735

(22) Filed: Apr. 21, 2005

(65) Prior Publication Data

US 2005/0237507 A1    Oct. 27, 2005

(30) Foreign Application Priority Data

Apr. 23, 2004    (JP)    ............... 2004-128802

(51) Int. Cl.
G03B 27/42    (2006.01)
G03B 27/58    (2006.01)

(52) U.S. Cl. .................. 355/53; 355/55; 355/72; 356/400; 356/620

(58) Field of Classification Search .................. 355/55, 355/53; 356/620
See application file for complete search history.

(56) References Cited

U.S. PATENT DOCUMENTS

| | | | |
|---|---|---|---|
| 5,585,925 A * | 12/1996 | Sato et al. .................. 356/401 |
| 5,986,766 A | 11/1999 | Koga et al. .................. 356/401 |
| 6,342,703 B1 | 1/2002 | Koga et al. .................. 250/548 |
| 6,538,260 B1 | 3/2003 | Koga .................. 250/548 |
| 6,586,160 B2 * | 7/2003 | Ho et al. .................. 430/311 |
| 6,762,825 B2 * | 7/2004 | Hayashi et al. .................. 355/55 |
| 7,038,762 B2 * | 5/2006 | Boettiger et al. .................. 355/53 |
| 2002/0085184 A1 * | 7/2002 | Amano .................. 355/30 |
| 2002/0175300 A1 * | 11/2002 | Suzuki et al. .................. 250/548 |
| 2002/0176096 A1 * | 11/2002 | Sentoku et al. .................. 356/620 |
| 2003/0053040 A1 * | 3/2003 | Hayashi et al. .................. 355/55 |
| 2004/0119960 A1 * | 6/2004 | Osakabe et al. .................. 355/53 |
| 2005/0237507 A1 | 10/2005 | Koga .................. 355/55 |

* cited by examiner

*Primary Examiner*—D. Rutledge
(74) *Attorney, Agent, or Firm*—Fitzpatrick, Cella, Harper & Scinto

(57) ABSTRACT

An exposure apparatus includes an original stage arranged to hold a reflective original having a pattern, a substrate stage arranged to hold a substrate, an illumination optical system arranged to emit exposure light along a first direction inclined from a direction of a reflection surface of the reflective original, a projection optical system arranged to project the pattern onto the substrate along a second direction using the exposure light reflected by the reflection surface of the reflective original, an original reference member arranged on the original stage or the reflective original, a substrate reference member, having a substrate mark, arranged on the substrate stage or the substrate, and a detector arranged to detect light from the substrate mark of the substrate reference number, which is illuminated with light.

11 Claims, 15 Drawing Sheets

RETICLE STAGE FOCUS MARK

WAFER STAGE FOCUS MARK

US 7,315,348 B2

EXPOSURE APPARATUS, FOCAL POINT DETECTING METHOD, EXPOSURE METHOD AND DEVICE MANUFACTURING METHOD

FIELD OF THE INVENTION

The present invention relates to an exposure apparatus, a focal point detecting method, an exposure method, and a device manufacturing method and, more particularly, to an exposure apparatus, which projects and transfers a pattern of a reflective original onto a substrate, a focal point detecting method to be applied to the exposure apparatus, an exposure method to be applied to the exposure apparatus and a device manufacturing method using the exposure method.

BACKGROUND OF THE INVENTION

In recent years, as the integration density of a semiconductor device represented by a DRAM increases more and more, the feature size of a pattern to be formed on the semiconductor device shrinks more and more. Under these circumstances, in a semiconductor exposure apparatus, the NA (Numerical Aperture) of a projection optical system increases, and the depth of focus decreases accordingly. Hence, a technique for accurately positioning a reticle (original) and a wafer (substrate) at conjugate positions with respect to the projection optical system has become significant.

The wafer is positioned on the focus (focal point) of the projection optical system by adjusting the positional relationship between the projection optical system and a reference member provided to a wafer stage which supports the wafer. The reticle is positioned on the focus of the projection optical system by adjusting the positional relationship between the projection optical system and a reference member on a reticle stage which holds the reticle.

A first conventional example of a method of detecting the focal point of a projection optical system with respect to a reference member on a wafer stage will be described.

Referring to FIG. 7, a transmissive reticle 1 is illuminated by an illumination optical system 4, and the pattern of the reticle 1 is projected onto a resist-applied wafer 2 by a projection optical system 3. An evaluating unit 5 illuminates a focus mark which is formed on a reference member 13 on a wafer stage 12 with measuring light through a projection optical system 3, and evaluates it. The evaluating unit 5 has an illumination unit 6, a focal point changing unit 7 which changes the focal point of the evaluating unit 5 by a relay lens or the like, a photo-receiving unit 8 such as an image sensor, and the like.

A reticle stage 10 can move in a three-dimensional direction while holding the reticle 1, and is provided with a reference member 11 having a reflecting surface. A wafer stage 12 can move in the three-directional direction while holding the wafer 2, and is provided with the reference member 13 having the focus mark. A reticle stage height detector 14 measures the position (i.e., the height) of the reticle stage 10 in the direction of the optical axis of the projection optical system 3. A detector 15 which detects the height of the wafer stage 12 measures the position (i.e., the height) of the wafer stage 12 in the direction of the optical axis of the projection optical system 3. A controller 9 controls the operation of the exposure apparatus. For example, the controller 9 controls the positions of the reticle stage 10 and wafer stage 12, and detects the focal point of the projection optical system 3 while controlling the reticle stage 10, wafer stage 12, and evaluating unit 5.

The operation of the exposure apparatus shown in FIG. 7 will be briefly described. First, the exposure apparatus detects the focal point of the projection optical system 3 with respect to the reference member 13 on the wafer stage 12 in accordance with a procedure to be described later to move the wafer stage 12 to the focal point of the projection optical system 3. Subsequently, the exposure apparatus moves the reticle stage reference member 11 to the focal point of the illumination optical system 4 which is measured or adjusted in advance by using the reticle stage height detector 14, illuminates the pattern on the reticle 1 with illumination light from the illumination optical system 4, and projects and transfers the pattern onto the reticle 1 through the projection optical system 3. Before exposing the wafer 2, the exposure apparatus has an alignment measurement unit (not shown) to align the reticle 1 and wafer 2 relative to each other in a direction perpendicular to the optical axis of the projection optical system 3 as well.

The procedure for detecting the focal point of the reference member 13 on the wafer stage 12 will be described with reference to FIG. 8.

First, while moving the reticle stage 10 in the vicinity of the focus of the projection optical system 3 along the optical axis of the projection optical system 3, a contrast indicating the light quantity distribution of the focus mark on the wafer stage 12 is measured at a plurality of portions, to obtain the reticle stage position (axis of abscissa) and the contrast (axis of ordinate) obtained then, as shown in FIG. 4. The focal point of the projection optical system 3 with respect to the wafer stage 12 is calculated on the basis of the position of the reticle stage 10 at which the contrast becomes the maximum. When the reticle stage 10 is moved along the optical axis of the projection optical system 3, the reticle stage 10 is undesirably shifted from the focal point of the evaluating unit 5. Hence, the focal point of the evaluating unit 5 is changed by using the focal point changing unit 7 in the evaluating unit 5, so that the focal point of the evaluating unit 5 can be aligned with the position of the reticle stage 10.

FIG. 9 shows an example of the focus mark on the wafer stage 12. When the focus mark is at the focal point of the projection optical system 3, the contrast of the mark image of FIG. 9 becomes the maximum. As the focus mark moves away from the focal point of the projection optical system 3, the contrast decreases. For example, when the photo-receiving unit 8 includes an image sensor, the light quantity change amount in the directions (broken lines A and B in FIG. 9) of the short sides of respective rectangles in a mark image sensed by the photo-receiving unit 8 is calculated as the sum of the difference values between adjacent pixels, thereby measuring the contrast.

The focal point of the projection optical system 3 with respect to the reference member 13 on the wafer stage 12 can be specifically detected in accordance with the procedure shown in FIG. 8. First, in original driving step S201, the reticle stage 10 is moved along the optical axis of the projection optical system 3. In measured focal point changing step S202, the focal point of the evaluating unit 5 is aligned with the reference member 11 provided to the reticle stage 10 by using the focal point changing unit 7 in the evaluating unit 5. Subsequently, in light quantity measuring step S203, the focus mark image on the wafer stage 12 is sensed by using the evaluating unit 5, and the contrast of the sensed mark image is calculated by an arithmetic operation unit. This series of steps is repeatedly performed under the control of the controller 9, while changing the position of the reticle stage 10. Finally, in focal point calculating step S204, the focal point of the projection optical system 3 is calculated by the method, which is described above with reference to FIG. 4.

The positions of the reticle stage 10 and wafer stage 12 in the direction of the optical axis of the projection optical system 3 can be measured by using the reticle stage height detector 14 and wafer stage height detector 15, and controlled by the controller 9 on the basis of the measurement results.

The above method is to calculate the focal point of the projection optical system 3 with respect to the reference member 13 while changing the position of the reticle stage 10 in the direction of the optical axis of the projection optical system 3. Alternatively, the focal point of the projection optical system 3 with respect to the reference member 13 can also be calculated by measuring the contrast of the mark image while changing the position of the wafer stage 12 in the direction of the optical axis of the projection optical system 3. A contrast change, which occurs when the position of the reticle stage 10 is changed, is more moderate than a contrast change, which occurs when the position of the wafer stage 12 is changed by the square of the reduction ratio of the projection optical system 3. Therefore, the former method is advantageous in that it is less influenced by an error in position of the stage, which is measured by the optical axis method of the projection optical system 3. Generally, the reduction ratio of a projection optical system used in an exposure apparatus is 1/4 or 1/5. The influence of an error in position of the stage is accordingly, 1/16 or 1/25.

A second conventional example of the method of detecting the focal point of the projection optical system with respect to the reference member on the wafer stage will be described.

Referring to FIG. 10, a transmissive reticle 1 is illuminated by an illumination optical system 4, and the pattern of the reticle 1 is projected onto a resist-applied wafer 2 by a projection optical system 3. A measurement illumination unit 16 illuminates a focus mark which is formed on a reticle stage 10 and furthermore a focus mark formed on a wafer stage 12 through the projection optical system 3 with measuring light. The measurement illumination unit 16 has an illumination unit 6 and a focal point changing unit 7 which changes the focal point of the measurement illumination unit 16 by a relay lens or the like.

The reticle stage 10 can move in a three-dimensional direction while holding the reticle 1, and is provided with a reference member 11 having the slit-shaped focus mark. The wafer stage 12 can move in the three-directional direction while holding the wafer 2, and is provided with a reference member 13 having a slit-shaped mark and a photo-receiving unit 8, e.g., a light quantity sensor, which is arranged under the reference member 13. A controller 9 controls the operation of the exposure apparatus. For example, the controller 9 controls the positions of the reticle stage 10 and wafer stage 12, and detects the focal point of the projection optical system 3 while controlling the reticle stage 10, wafer stage 12, and measurement illumination unit 16.

In this example, the measurement illumination unit 16 and the photo-receiving unit 8 on the wafer stage 12 form an evaluating unit. A reticle stage height detector 14 measures the position (i.e., the height) of the reticle stage 10 in the direction of the optical axis of the projection optical system 3. A wafer stage height detector 15 measures the position (i.e., the height) of the wafer stage 12 in the direction of the optical axis of the projection optical system 3.

The focus marks on the reference members 11 and 13 on the reticle stage 10 and wafer stage 12 have shapes shown in FIGS. 11A and 11B, respectively. The focus marks are used for detecting the focal point of the projection optical system 3 after their positions are aligned relative to each other in a direction perpendicular to the optical axis of the projection optical system 3. When the two reference members 11 and 13 are at conjugate positions with respect to the projection optical system 3, the light quantity of the measuring light, which is to be received by the photo-receiving unit 8, from the measurement illumination unit 16, becomes the maximum. The outline of the operation of the exposure apparatus shown in FIG. 10 is identical to that of the first conventional example and a description thereof will, accordingly, be omitted.

The procedure for detecting the focal point of the reference member 13 on the wafer stage 12 will be described with reference to FIG. 6.

First, while moving the reticle stage 10 in the vicinity of the focus of the projection optical system 3 a plurality of number of times along the optical axis of the projection optical system 3, the measuring light passing through the focus marks on the reticle stage 10 and wafer stage 12 is received by the photo-receiving unit 8, and its light quantity is measured to obtain the reticle stage position (axis of abscissa) and the light quantity (axis of ordinate) as shown in FIG. 6. The focal point of the projection optical system 3 with respect to the wafer stage 12 is calculated on the basis of the position of the reticle stage 10 at which the light quantity becomes the maximum. When the reticle stage 10 is moved along the optical axis of the projection optical system 3, the reticle stage 10 is undesirably shifted from the focal point of the measurement illumination unit 16. Hence, the focal point of the measurement illumination unit 16 is changed by using the focal point changing unit 7 in the measurement illumination unit 16, so that the focal point of the measurement illumination unit 16 can be aligned with the position of the reticle stage 10.

More specifically, the focal point of the projection optical system 3 can be detected in accordance with the procedure shown in FIG. 8 in the same manner as that in the first conventional example. First, in original driving step S201, the reticle stage 10 is moved along the optical axis of the projection optical system 3. In measured focal point changing step S202, the focal point of the measurement illumination unit 16 is aligned with the reference member 11 provided to the reticle stage 10 by using the focal point changing unit 7 in the measurement illumination unit 16. Subsequently, in light quantity measuring step S203, the light quantity of the illumination light from the measurement illumination unit 16 is measured by using the photo-receiving unit 8 provided to the wafer stage 12. This series of steps is repeatedly performed under the control of the controller 9 while changing the position of the reticle stage 10. Finally, in focal point calculating step S204, the focal point of the projection optical system 3 is calculated by the method, which is described above with reference to FIG. 6.

The positions of the reticle stage 10 and wafer stage 12 in the direction of the optical axis of the projection optical system 3 can be measured by using the reticle stage height detector 14 and wafer stage height detector 15, and controlled by the controller 9 on the basis of the measurement results.

The second conventional method is to calculate the focal point of the projection optical system 3 with respect to the reference member 13 while changing the position of the reticle stage 10 in the direction of the optical axis of the projection optical system 3, in the same manner as in the first conventional example. Alternatively, the focal point of the projection optical system 3 with respect to the reference member 13 can also be calculated by measuring the illumination light quantity while changing the position of the wafer stage 12 in the direction of the optical axis of the projection optical system 3, in the same manner as in the first conventional example. Due to the same reason as in the first conventional example, the former method is advantageous in that it is less influenced by an error in position of the stage which is measured by the optical axis method of the projection optical system.

In the conventional examples described above, the focal point of a projection optical system with respect to a reference member provided to a wafer or wafer stage is detected, so that a fine circuit pattern can be exposed even in a high NA projection exposure apparatus, which has a small depth of focus.

Conventionally, as a pattern exposure method in the manufacture of a semiconductor microdevice, such as a semiconductor memory or logic circuit, reduction-projection-exposure, which uses ultraviolet rays, is used. The minimum size of a pattern that can be transferred by reduction-projection-exposure is proportional to the wavelength of light used for the transfer and inversely proportional to the NA of the projection optical system. Therefore, a decrease in wavelength of illumination light used to transfer a fine circuit pattern has been developed. The wavelength of ultraviolet light used as the illumination light is decreasing more and more, e.g., mercury lamp i-line (wavelength: 365 nm), a KrF excimer laser (wavelength: 248 nm), and an ArF excimer laser (wavelength: 193 nm). The feature size of the semiconductor device shrinks furthermore, and lithography using ultraviolet light will reach its limit sooner or later.

In order to transfer a smaller circuit pattern efficiently, a demand has arisen for a reduction projection exposure apparatus which uses extreme ultra violet light (EUV light) having a wavelength of about 10 nm to 15 nm, which is further shorter than the wavelength of ultraviolet rays, and such an apparatus is under development. EUV light is largely absorbed by a material, it is difficult to use a lens optical system, like one used with visible light or ultraviolet light, which utilizes refraction of light. Hence, in an exposure apparatus using EUV light, a reflective optical system is used. In this case, as a reticle to serve as an original, a reflecting reticle, which is obtained by forming, with an absorber, a pattern to be transferred on a mirror, is used.

FIG. 12 is a view schematically showing a reduction projection exposure apparatus which uses EUV light. Referring to FIG. 12, a reflecting reticle 1 is illuminated by an illumination optical system 4, and the pattern of the reticle 1 is projected onto a resist-applied wafer 2 by a projection optical system 3. A measurement unit 5 illuminates a focus mark on a wafer stage 12 with non-exposure light, and measures it. Alternatively, a measurement illumination unit 16 illuminates a focus mark on a reticle stage 10 and, furthermore, the focus mark on the wafer stage 12 through the projection optical system 3 with non-exposure light.

The reticle stage 10 can move in a three-dimensional direction while holding the reticle 1, and is provided with a reference member 11. The wafer stage 12 can move in the three-directional direction while holding the wafer 2, and is provided with a reference member 13. A reticle stage height detector 14 measures the position (i.e., the height) of the reticle stage 10 in the direction of the optical axis of the projection optical system 3. A wafer stage height detector 15 measures the position (i.e., the height) of the wafer stage 12 in the direction of the optical axis of the projection optical system 3. A controller 9 controls the positions of the reticle stage 10 and wafer stage 12.

Since the reduction projection exposure apparatus, which utilizes EUV light, uses the reflecting reticle, the optical axis of the evaluating unit 5 or measurement illumination unit 16 and the optical axis of the projection optical system 3 are not parallel, unlike in the first or second conventional example. Therefore, as shown in FIG. 13, when the position of the reticle stage 10 is changed, the focus mark on the reference member 13 is undesirably shifted from the optical path of the measuring light, and cannot be evaluated by the evaluating unit 5 or a photo-receiving unit 8. This phenomenon can occur regardless of the moving direction of the reticle stage 10. The fact that the focus mark cannot be evaluated means that the focus of the projection optical system 3 cannot be detected.

SUMMARY OF THE INVENTION

The present invention has been made on the basis of the recognition of the above situations, and has as an exemplified object to enable detection of a focal point of a projection optical system in an exposure apparatus which projects and transfers a pattern of a reflective original onto a substrate.

According to the first aspect of the present invention, there is provided an exposure apparatus having a movable original stage to hold a reflective original, a movable substrate stage to hold a substrate, an illumination optical system to illuminate a pattern of the reflective original, and a projection optical system to project the pattern onto the substrate. The apparatus comprises an evaluating unit which detects and evaluates measuring light through a first reference member formed on the substrate stage or the substrate, the projection optical system and a second reference member formed on the original stage or the reflective original, and a processor which derives a focal point of the projection optical system based on an evaluation result of the evaluating unit. The processor controls a position of the original stage in a direction along an optical axis of the illumination optical system, and a position of the substrate stage in a direction substantially perpendicular to an optical axis of the projection optical system, so that the measuring light is incident on the first reference member through the second reference member and the projection optical system.

According to the preferred embodiment of the present invention, the first reference member can include a mark, and the evaluating unit can be arranged to calculate a contrast of an image of the mark.

According to the preferred embodiment of the present invention, the first reference member can include a mark, the second reference member can include a mark, and the evaluating unit can be arranged to measure a light amount of the measuring light through the second reference member and the first reference member.

According to the preferred embodiment of the present invention, the evaluating unit can comprise a measurement illumination unit which emits the measuring light so that the measuring light is incident on the second reference member.

According to the second aspect of the present invention, there is provided a focal point detecting method of detecting a focal point of a projection optical system, to project a pattern of a reflective original onto a substrate, in an exposure apparatus having a movable original stage to hold a reflective original, a movable substrate stage to hold a substrate, an illumination optical system to illuminate the pattern of the reflective original, and the projection optical system. The method comprises an evaluating step detecting and evaluating measuring light through a first reference member formed on the substrate stage or the substrate, the projection optical system and a second reference member formed on the original stage or the reflective original, a moving step of moving the original stage along an optical axis of the illumination optical system, and moving the substrate stage in a direction substantially perpendicular to an optical axis of the projection optical system so that the measuring light is incident on the first reference member through the second reference member and the projection optical system, and a processing step of deriving the focal point of the projection optical system based on an evaluation result obtained in the evaluating step with respect to each of a plurality positions of the original stage moved in the moving step.

According to the third aspect of the present invention, there is provided an exposure method performed by an exposure apparatus having a movable original stage to hold a reflective original, a movable substrate stage to hold a substrate, an illumination optical system to illuminate a pattern of the reflective original, and a projection optical system to project the pattern of the reflective original onto the substrate. The method comprises an evaluating step of detecting and evaluating measuring light through a first reference member formed on the substrate stage or the substrate, the projection optical system and a second reference member formed on the original stage or the reflective original, a moving step of moving the original stage along an optical axis of the illumination optical system, and moving the substrate stage in a direction substantially perpendicular to an optical axis of the projection optical system so that the measuring light is incident on the first reference member through the second reference member and the projection optical system, and a processing step of deriving the focal point of the projection optical system based on an evaluation result obtained in the evaluating step with respect to each of a plurality positions of the original stage moved in said moving step, a focusing step of moving the substrate stage based on the focal point derived in the processing step, and a projecting step of projecting the pattern of the reflective original onto the moved substrate through the projection optical system.

According to the fourth aspect of the present invention, there is provided a method of manufacturing a device, comprising steps of projecting a pattern of a reflective original onto a substrate in accordance with the above exposure method, developing the substrate onto which the pattern has been projected, and processing the developed substrate to manufacture the device.

According to the present invention, for example, in an exposure apparatus which projects and transfers the pattern of a reflective original onto a substrate, detection of the focal point of a projection optical system is enabled.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

DETAILED DESCRIPTION OF THE PREFERRED EMBODIMENTS

The preferred embodiments of the present invention will be described with reference to the accompanying drawings.

Figure 2:
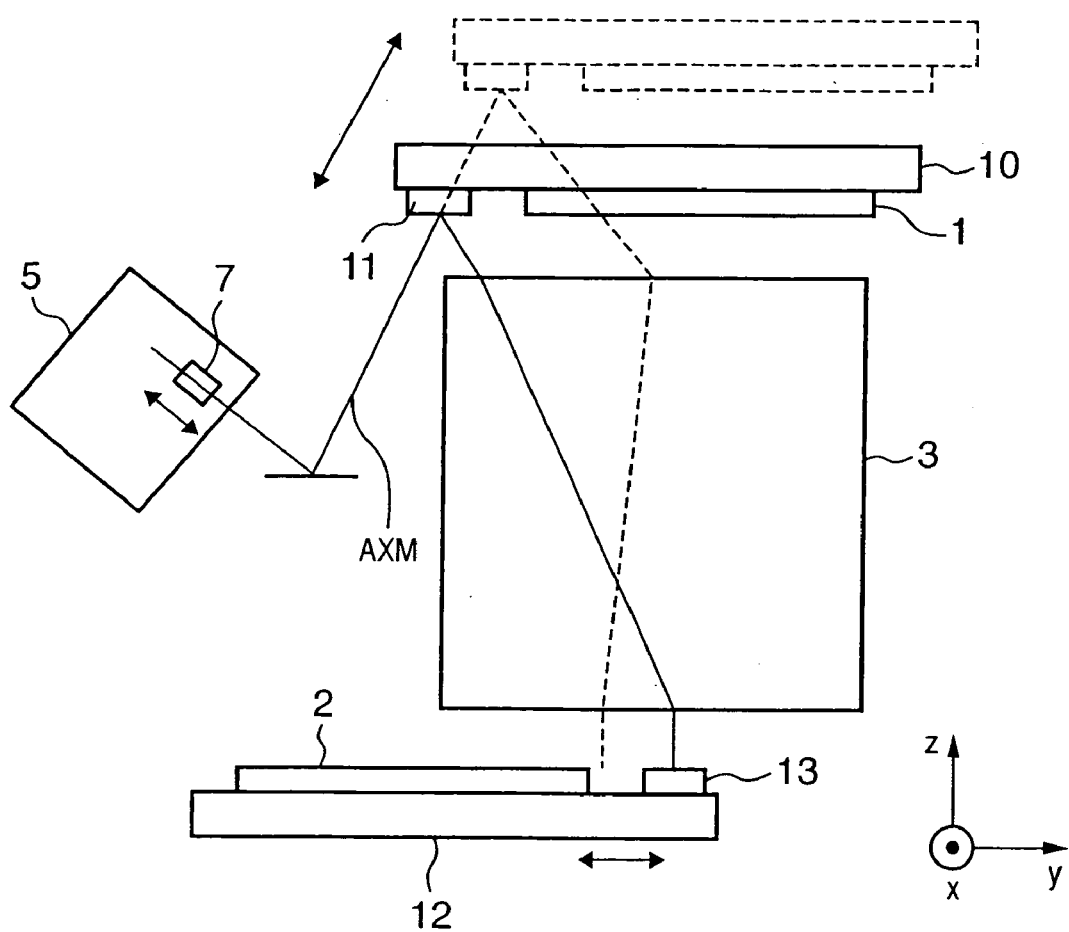
FIG. 2 is a view showing the schematic structure of an exposure apparatus to which the present invention is applied.

FIG. 2 is a view showing the schematic structure of an exposure apparatus to which the present invention is applied. According to the present invention, when the focal point of a projection optical system 3 with respect to a wafer (or a reference member on a wafer stage) is to be detected, a focus mark is evaluated not while moving a reticle stage 10 along the optical axis of the projection optical system 3, but while moving the reticle stage 10 along an optical axis AXM of the measuring light, as shown in FIG. 2. Thus, the entering position of the measuring illumination light with respect to a reference member 11 provided to the reticle stage 10 can be maintained stable. As the reticle stage 10 moves, the optical path of the measuring light changes. Hence, a wafer stage 12 is driven in a direction substantially perpendicular to the optical axis of the projection optical system 3 in accordance with the position of the reticle stage 10. With this method, although the wafer stage 12 must be driven during measurement, as the driving direction is a direction (e.g., a direction parallel to the x-y plane) perpendicular to the optical axis (e.g., z direction) of the projection optical system 3, the influence that the driving error of the wafer stage 12 imposes on the focal point detection result is smaller than in a case wherein the wafer stage 12 is driven along the optical axis of the projection optical system 3.

Practical embodiments of the present invention will be described hereinafter.

First Embodiment

Figure 3:
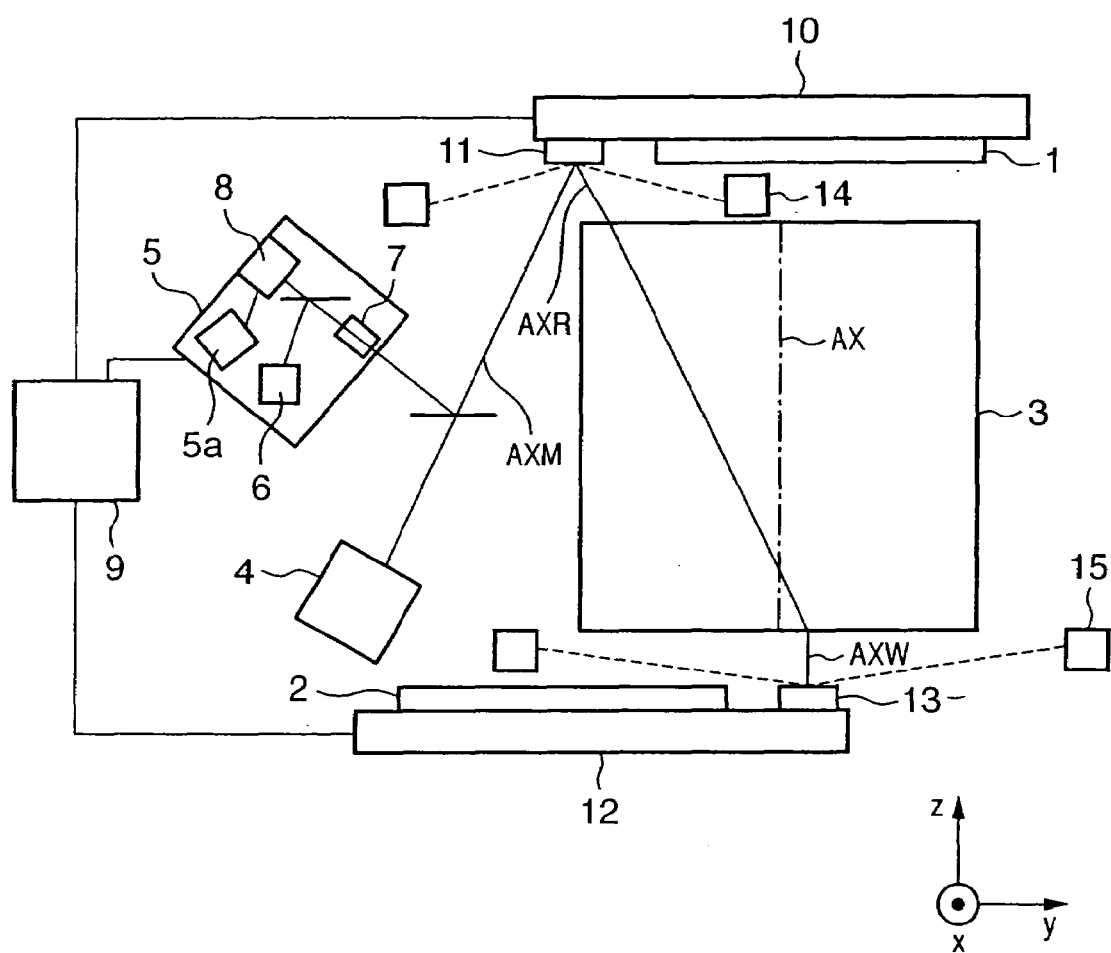
FIG. 3 is a view showing the schematic structure of an exposure apparatus according to the first embodiment of the present invention.

FIG. 3 is a view showing the schematic structure of an exposure apparatus according to the first embodiment of the present invention. A reflecting reticle (reflective original) 1 is illuminated by an illumination optical system 4, and the pattern of the reticle 1 is projected and transferred onto a resist-applied wafer (substrate) 2 by a projection optical system 3. An evaluating unit 5 illuminates a focus mark (first optical element), which is formed on a reference member 13 provided to a wafer stage (substrate stage) 12 with non-exposure light (measuring light) through the reticle (original) 1 and, furthermore, the projection optical system 3, and evaluates it. The evaluating unit 5 is arranged beside the projection optical system 3, and has an illumination unit 6, a focal point changing unit 7, a photo-receiving unit 8, such as an image sensor, and the like. The illumination unit 6 emits measuring light toward a reflecting surface of the reference member (second optical element) 11 formed on a reference member provided to a reticle stage (original stage) 10 along a predetermined optical path to illuminate a focus mark formed on the reference member 13 through the reference member 11. The focal point changing unit 7 changes the focal point of the evaluating unit 5 by a relay lens, or the like.

The reticle stage 10 can move in a three-dimensional direction while holding the reticle 1, and is provided with the reference member 11 having a reflecting surface. The wafer stage 12 can move in the three-directional direction while holding the wafer 2, and is provided with the reference member 13 having the focus mark. A reticle stage height detector 14 measures the position (i.e., the height) of the reticle stage 10 in the direction of the optical axis (z direction) of the projection optical system 3. A wafer stage detector 15 measures the position (i.e., the height) of the wafer stage 12 in the direction of the optical axis of the projection optical system 3. A controller 9, which can also be referred to as a processor or a processing unit, controls the operation of the exposure apparatus. For example, the controller 9 controls the positions of the reticle stage 10 and the wafer stage 12, and detects the focal point of the projection optical system 3 while controlling the reticle stage 10, wafer stage 12, and evaluating unit 5. The operation of the exposure apparatus shown in FIG. 3 can follow the first conventional example except for matters to be described hereinafter.

Figure 4:
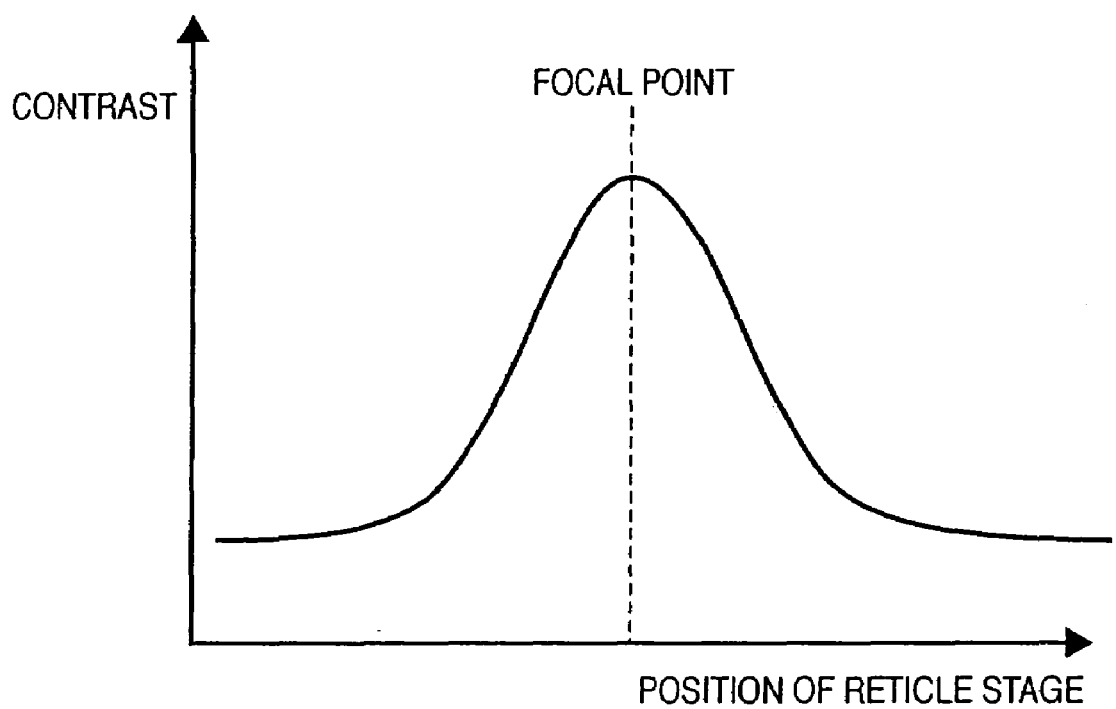
FIG. 4 is a graph for explaining a focal point calculating method in the first embodiment of the present invention.

The procedure for detecting the focal point of the projection optical system 3 with respect to the reference member 13 on the wafer stage 12 will be described with reference to FIG. 1. In the following procedure for detecting the focal point, the contrast of a mark image is measured a plurality of number of times while moving the reticle stage 10 in the vicinity of the focus of the projection optical system 3 along the optical axis AXM of the measuring light, to obtain the reticle stage position (axis of abscissa) and the contrast (axis of ordinate) as shown in FIG. 4. The focal point of the projection optical system 3 with respect to the wafer stage 12 is calculated on the basis of the position of the reticle stage 10 at which the contrast becomes the maximum.

As the position of the reticle stage 10 when the focal point of the reticle stage 10 is to be calculated, the position of the reticle 1 along a reticle-side optical axis AXM of the projection optical system 3 is used. Because the reticle stage 10 is moved along an optical axis AXM of the measuring light, the reticle stage 10 is undesirably shifted from the focal point of the evaluating unit 5. Thus, the focal point of the evaluating unit 5 is changed by using the focal point changing unit 7 in the evaluating unit 5, so that the focal point of the evaluating unit 5 is aligned with the position of the reticle stage 10. As the reticle stage 10 moves, the optical path of the measuring light changes. For this reason, the wafer stage 12 is moved in a direction (e.g., a direction parallel to the x-y plane) substantially perpendicular to a wafer-side optical axis AXM (e.g., parallel to the z-axis) of the projection optical system 3 in accordance with the position of the reticle stage 10.

As the driving direction of the wafer stage 12 is substantially perpendicular to the wafer-side optical axis AXM of the projection optical system 3, the influence that the driving error of the wafer stage 12 imposes on the focal point detection result is smaller than in a case wherein the wafer stage 12 is driven along the wafer-side optical axis AXM of the projection optical system 3. Furthermore, the reflecting surface of the reference member 11 provided to the reticle stage 10 and the focus mark of the reference member 13 provided to the wafer stage 12 are made with such sizes that do not influence measurement even when a driving error occurs in the reticle stage 10 or wafer stage 12. Namely, the reflecting surface of the reference member 11 and the focus mark of the reference member 13 are formed large enough, so no portions other than the reflecting surface and focus mark enter the field of view of the evaluating unit 5 even when a driving error occurs in the stage 10 or 12, the influence of the stage driving error can be minimized.

Figure 1:
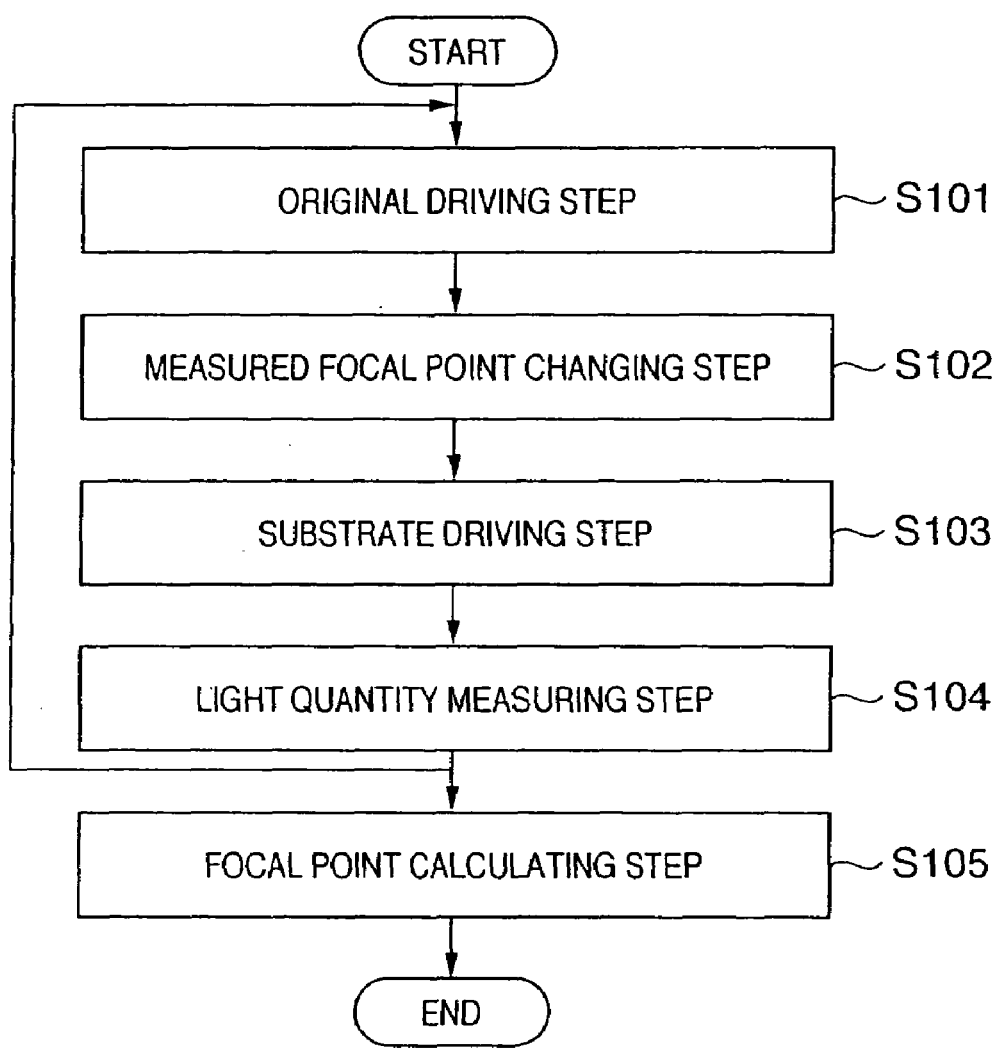
FIG. 1 is a flowchart showing a method of detecting the focal point of a projection optical system according to a preferred embodiment of the present invention.

More specifically, in this embodiment, the focal point of the projection optical system 3 is detected in accordance with the procedure shown in FIG. 1. First, in original driving step S101, the reticle stage 10 is moved along the optical axis AXM of the measuring light. Subsequently, in measured focal point changing step S102, the focal point of the evaluating unit 5 is aligned with the reference member 11 provided to the reticle stage 10 by using the focal point changing unit 7 in the evaluating unit 5. Subsequently, in substrate driving step S103, the wafer stage 12 is driven in a direction (e.g., x-y direction) substantially perpendicular to the wafer-side optical axis AXM of the projection optical system 3 to align the position of the reference member 13 provided to the wafer stage 12 with the optical path of the evaluating unit 5.

Subsequently, in mark image measuring step S104, the image of the focus mark formed on the reference member 13 on the wafer stage 12 is sensed by the evaluating unit 5, and the contrast of the sensed mark image is calculated by an arithmetic operation unit 5a. This series of steps is repeatedly performed under the control of the controller 9 while changing the position of the reticle 1. Finally, in focal point calculating step S105, the focal point is calculated by the method described above with reference to FIG. 4.

The positions of the reticle stage 10 and wafer stage 12 in the direction of the optical axis AX of the projection optical system 3 can be measured by the reticle stage height detector 14 and wafer stage height detector 15, and controlled by the controller 9 on the basis of the measurement results.

Second Embodiment

Figure 5:
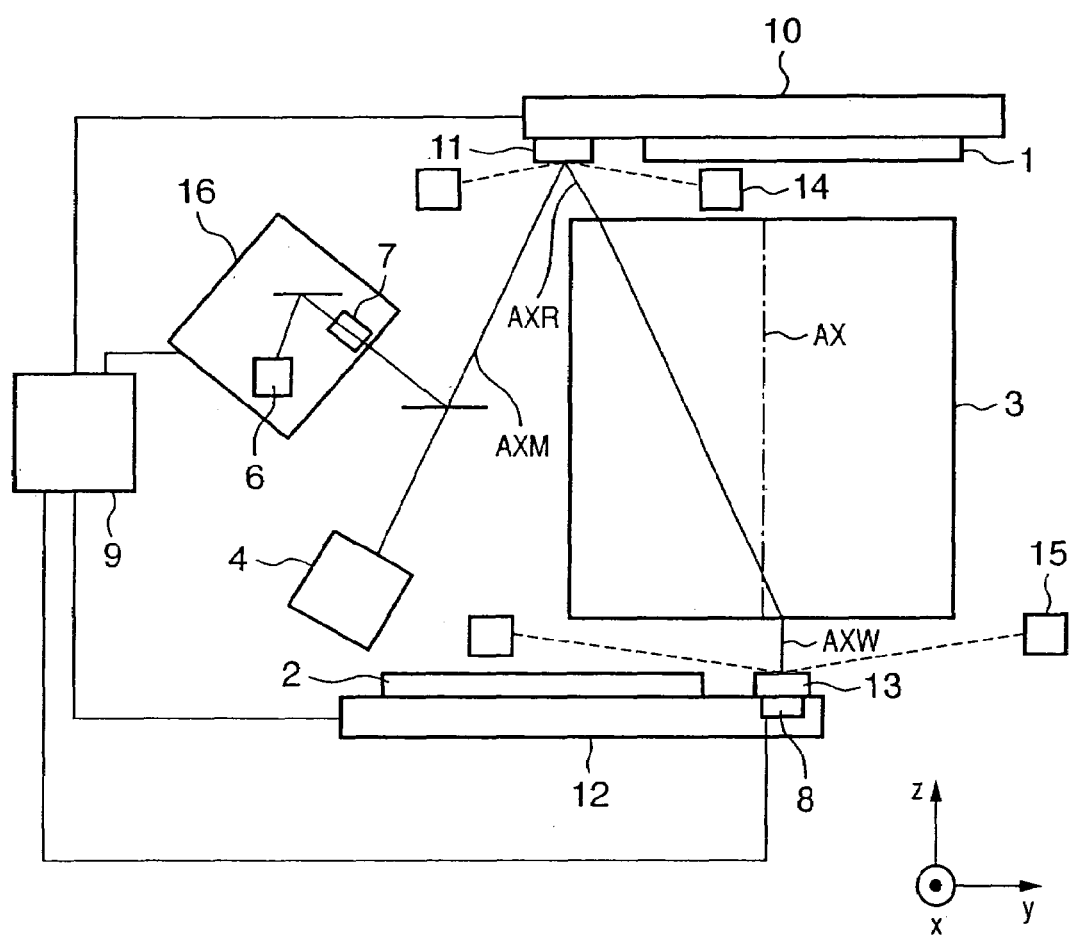
FIG. 5 is a view showing the schematic structure of an exposure apparatus according to the second embodiment of the present invention.

FIG. 5 is a view showing the schematic structure of an exposure apparatus according to the second embodiment of the present invention. A reflecting reticle 1 is illuminated by an illumination optical system 4, and the pattern of the reticle 1 is projected and transferred to a resist-applied wafer 2 by a projection optical system 3. A reticle stage 10 can move in a three-dimensional direction while holding the reticle 1, and is provided with a reference member 11 having a slit-shaped focus mark (second optical element). A wafer stage 12 can move in the three-directional direction while holding the wafer 2, and is provided with a reference member 13 having a slit-shaped focus mark (first optical element) and a photo-receiving unit 8, e.g., a light quantity sensor, arranged under the reference member 13.

A measurement illumination unit 16 illuminates the focus mark formed on the reference member 11 and, furthermore, the focus mark on the reference member 13 through the projection optical system 3 with non-exposure light (measuring light). The measurement illumination unit 16 is arranged beside the projection optical system 3. The measurement illumination unit 16 has an illumination unit 6, a focal point changing unit 7, such as a relay lens, and the like. The illumination unit 6 emits measuring light toward the reference member 11 along a predetermined optical path to illuminate the reference member 13 through the reference member 11. In the second embodiment, the measurement illumination unit 16 and the photo-receiving unit 8 provided to the wafer stage 12 form the evaluating unit.

A reticle stage height detector 14 measures the position (i.e., the height) of the reticle stage 10 in the direction of the optical axis AX (z direction) of the projection optical system 3. A wafer stage detector 15 measures the position (i.e., the height) of the wafer stage 12 in the direction of the optical axis AX of the projection optical system 3. A controller 9 controls the operation of the exposure apparatus. For example, the controller 9 controls the positions of the reticle stage 10 and wafer stage 12, and detects the focal point of the projection optical system 3 while controlling the reticle stage 10, wafer stage 12, and measurement illumination unit 16.

The shapes of the focus marks on the reference members 11 and 13 respectively provided to the reticle stage 10 and wafer stage 12, and how the focus marks are used are the same as those in the second conventional example. The operation of the exposure apparatus shown in FIG. 5 can follow the second conventional example except for the matters to be described hereinafter.

Figure 6:
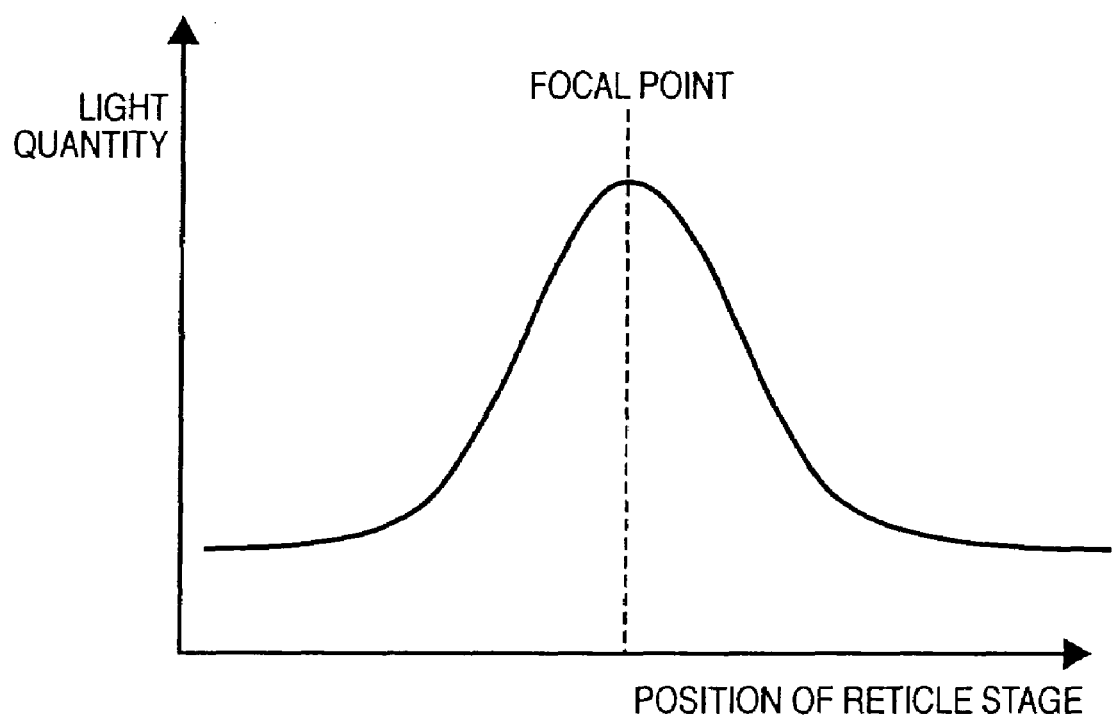
FIG. 6 is a graph for explaining a focal point calculating method in the second embodiment of the present invention.
Figure 7:
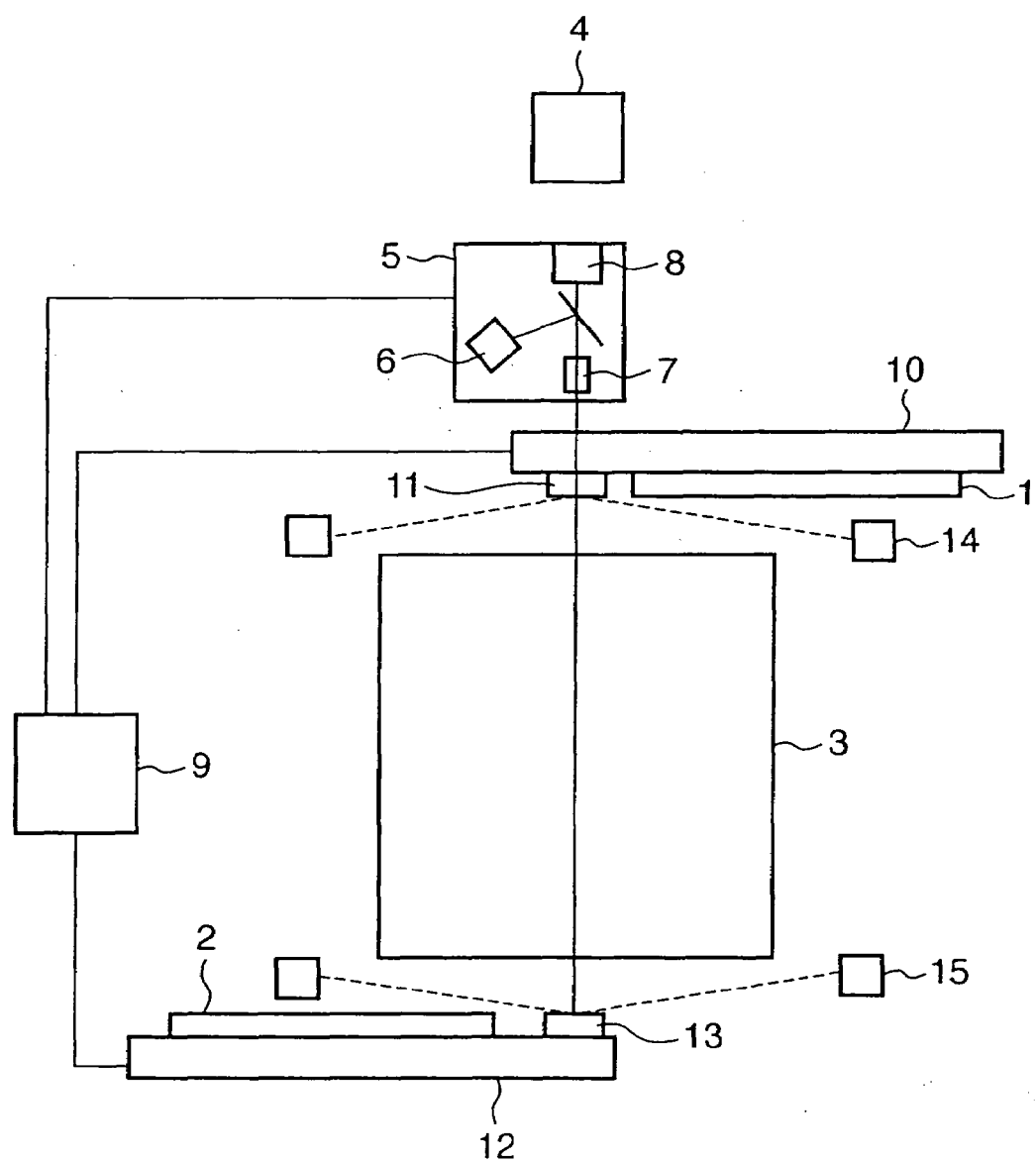
FIG. 7 is a view showing the schematic structure of an exposure apparatus according to the first conventional example.
Figure 8:
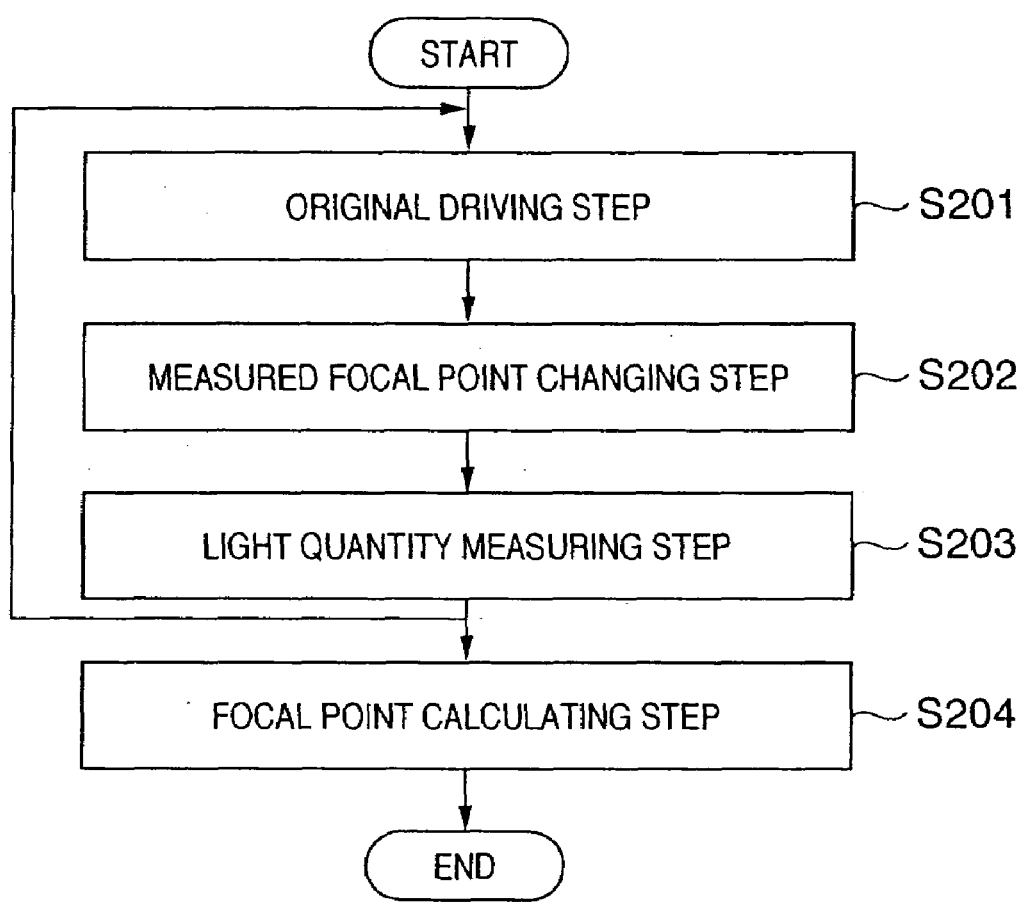
FIG. 8 is a flowchart showing a method of detecting the focal point of a projection optical system.
Figure 9:
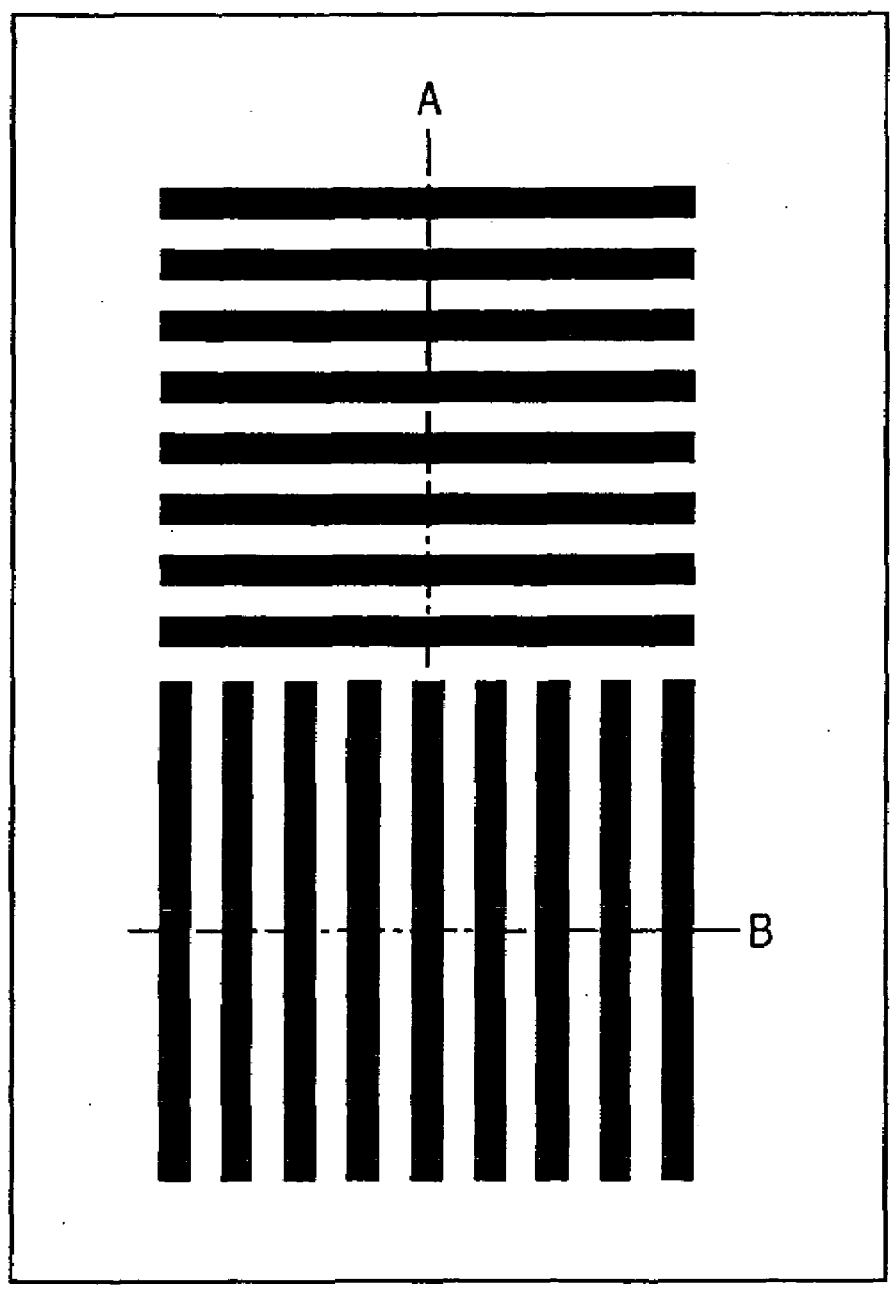
FIG. 9 is a view showing an example of a focus mark.
Figure 10:
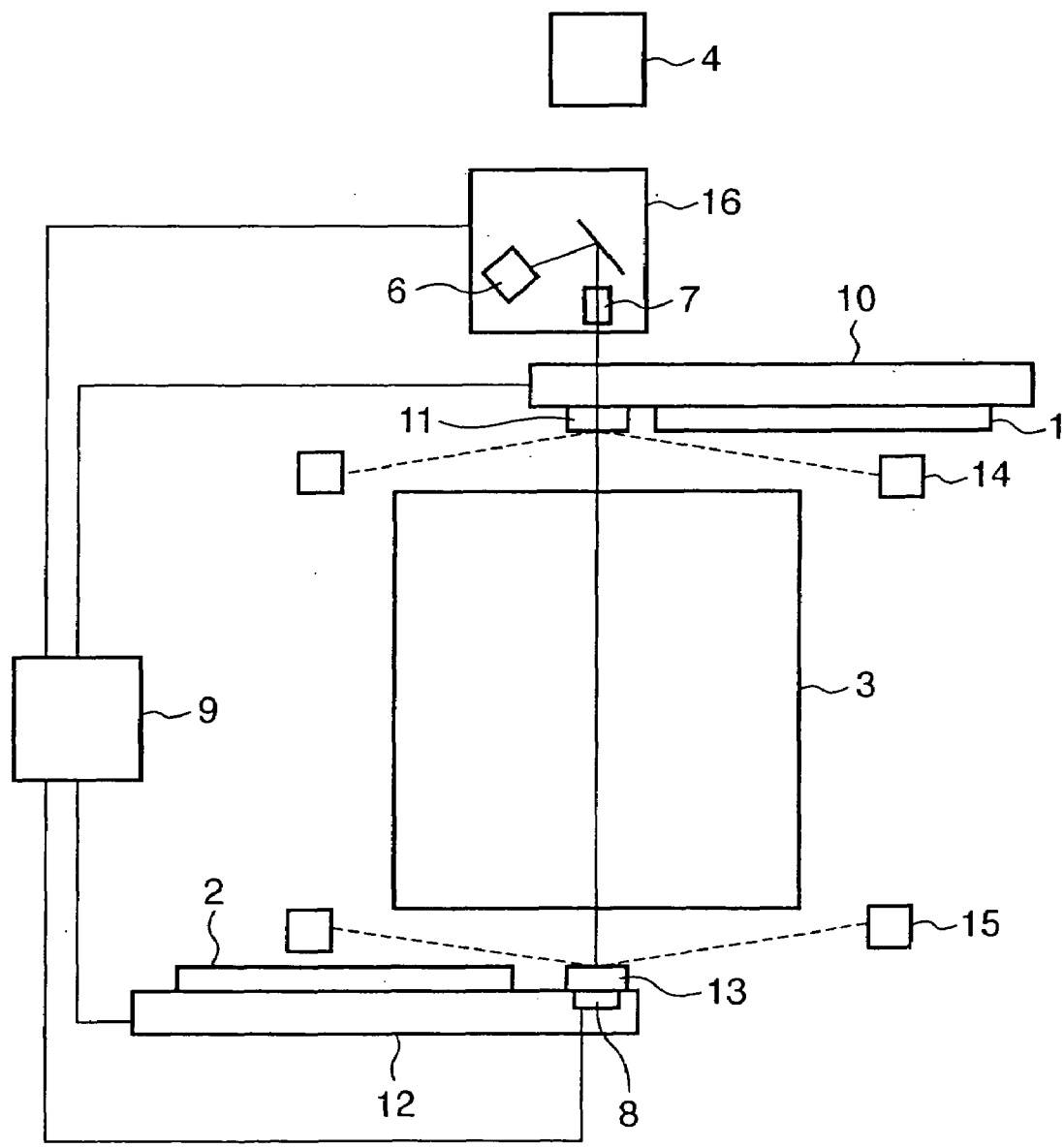
FIG. 10 is a view showing the schematic structure of an exposure apparatus according to the second conventional example.
Figure 11A:
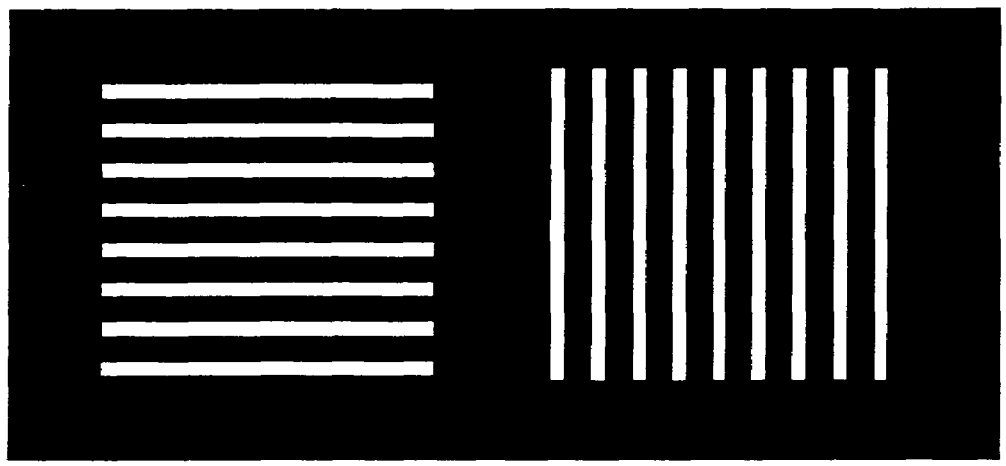
FIGS. 11A and 11B are views showing examples of focus marks.
Figure 11B:
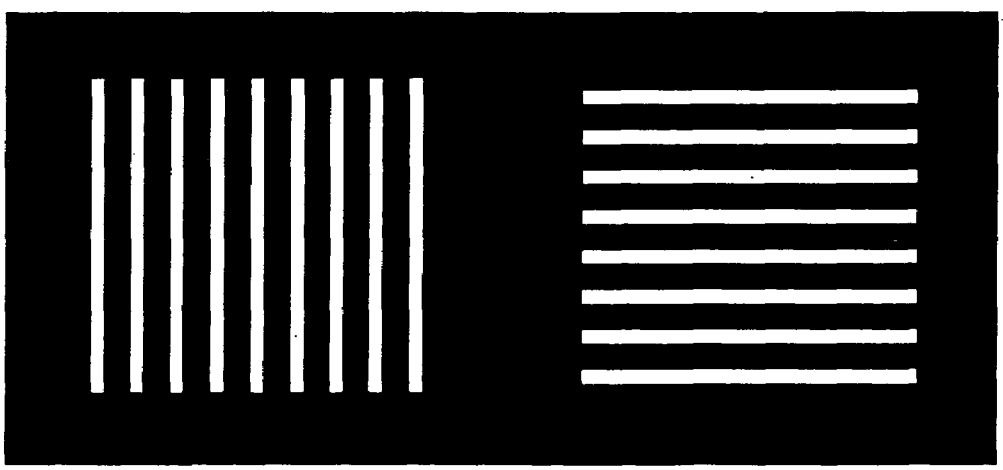
Figure 12:
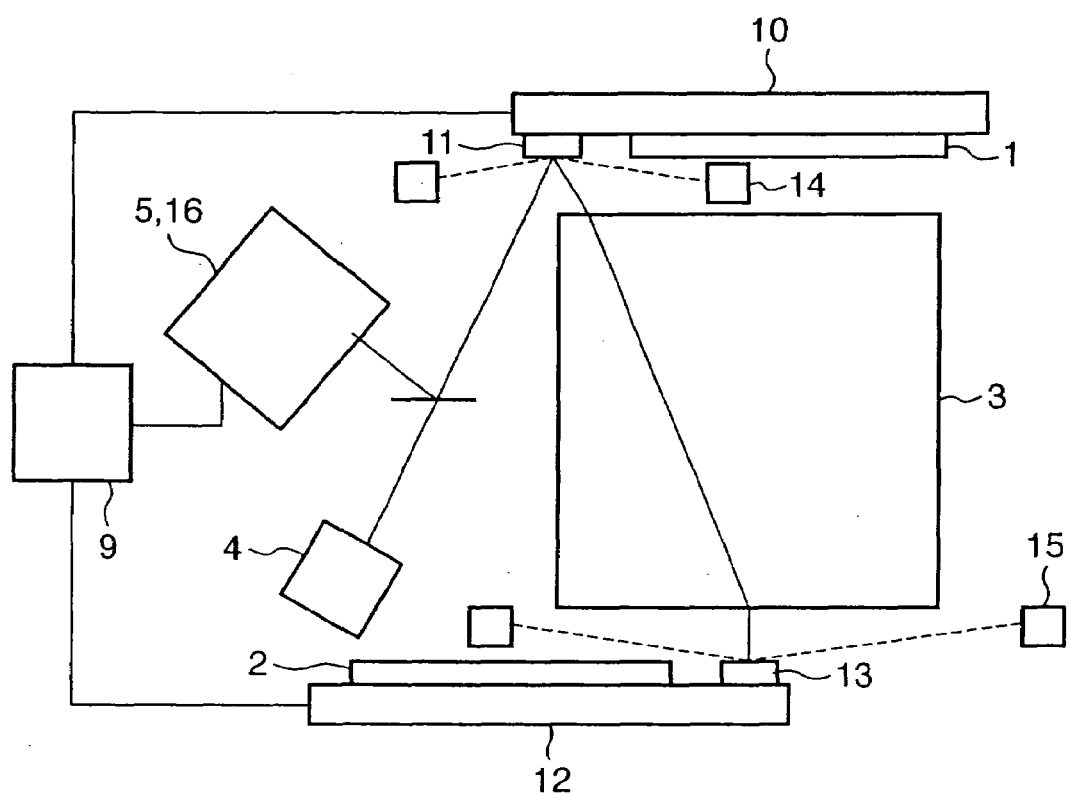
FIG. 12 is a view showing the schematic structure of an exposure apparatus which utilizes EUV light.
Figure 13:
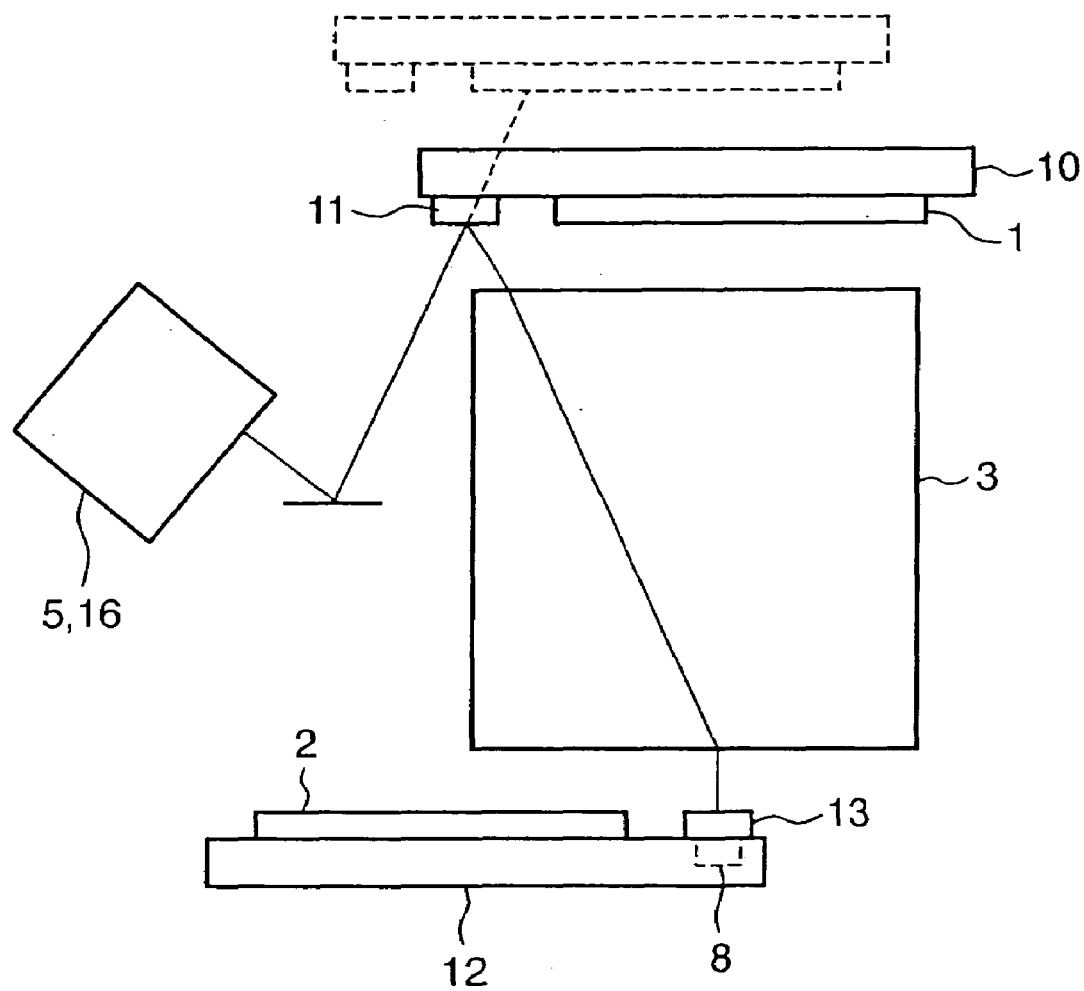
FIG. 13 is a view for explaining problems in the exposure apparatus which utilizes EUV light.

The procedure for detecting the focal point of the projection optical system 3 with respect to the reference member 13 on the wafer stage 12 will be described with reference to FIG. 1. In the following procedure for detecting the focal point, the light quantity of measurement light reflected by the reference member 11 and passing through the focus mark of the reference member 13 is measured by the photo-receiving unit 8, while moving the reticle stage 10 a plurality of number of times in the vicinity of the focus of the projection optical system 3 along an optical axis AXM of the measurement illumination unit 16, to obtain the reticle stage position (axis of abscissa) and the light quantity (axis of ordinate) as shown in FIG. 6. The focal point of the projection optical system 3 with respect to the wafer stage 12 is calculated on the basis of the position of the reticle stage 10 at which the light quantity becomes the maximum.

As the position of the reticle stage 10 when the focal point of the wafer stage 12 is to be calculated, the reticle position along a reticle-side optical axis AXM of the projection optical system 3 is used. Because the reticle stage 10 is moved along the optical axis AXM of the measuring light, the reticle stage 10 is undesirably shifted from the focal point of the measurement illumination unit 16. Thus, each time the reticle stage 10 is moved, the measurement illumination unit 16 must also be moved in the same manner as the reticle stage 10. When the focal point of the measurement illumination unit 16 is changed by using the focal point changing unit 7 in the measurement illumination unit 16, the focal point of the measurement illumination unit 16 can be aligned with the position of the reticle stage 10. As the reticle stage 10 moves, the optical path of the measuring light changes. For this reason, the wafer stage 12 is moved in a direction (e.g., a direction parallel to the x-y plane) substantially perpendicular to the wafer-side optical axis AXM (e.g., the z direction) of the projection optical system 3 in accordance with the position of the reticle stage 10.

As the driving direction of the wafer stage 12 is substantially perpendicular to the wafer-side optical axis AXM of the projection optical system 3, the influence that the driving error of the wafer stage 12 imposes on the focal point detection result is smaller than in a case wherein the wafer stage 12 is driven along the wafer-side optical axis AXM of the projection optical system 3. Furthermore, when the reticle stage 10 is moved a plurality of number of times along the optical axis AXM of the measurement illumination unit 16, the light quantity is measured each time while scanning the wafer stage 12 or both the reticle stage 10 and wafer stage 12 within a plane substantially perpendicular to the wafer-side optical axis AXM of the projection optical system 3, to measure the maximum light quantity (the light quantity obtained when the reticle stage 10 and wafer stage 12 are aligned). Then, the influence of the driving error of the wafer stage 12 can be decreased.

More specifically, the focal point of the projection optical system 3 is detected in accordance with the procedure shown in FIG. 1, in the same manner as that in the first embodiment. First, in original driving step S101, the reticle stage 10 is moved along the optical axis AXM of the measurement illumination unit 16. Subsequently, in measured focal point changing step S102, the focal point of the measurement illumination unit 16 is aligned with the reference member 11 provided to the reticle stage 10 by using the focal point changing unit 7 in the measurement illumination unit 16. Subsequently, in substrate driving step S103, the wafer stage 12 is driven in a direction (e.g., X-Y direction) substantially perpendicular to the wafer-side optical axis AXM of the projection optical system 3 to align the position of the reference member 13 on the wafer stage 12 with the optical path of the measurement illumination unit 16.

Subsequently, in light quantity measuring step S104, the light quantity of measuring light from the measurement illumination unit 16 is measured by the photo-receiving unit 8 provided to the wafer stage 12. This series of steps is repeatedly performed under the control of the controller 9 while changing the position of the reticle 1. Finally, in focal point calculating step S105, the focal point is calculated by the method described above with reference to FIG. 6.

The positions of the reticle stage 10 and wafer stage 12 in the direction of the optical axis AX of the projection optical system 3 can be measured by using the reticle stage height detector 14 and wafer stage height detector 15, and controlled by the controller 9 on the basis of the measurement results.

[Modification]

In the first and second embodiments, the focal point is detected by using the reflecting surface formed on the reference member 11 of the reticle stage 10 or the focus mark formed on the reference member 13 of the wafer stage 12. However, such a reference member need not always be used. The focal point may be detected by using, e.g., the reflecting surface of the reticle 1 or the focus mark of the wafer 2.

[Application]

Figure 14:
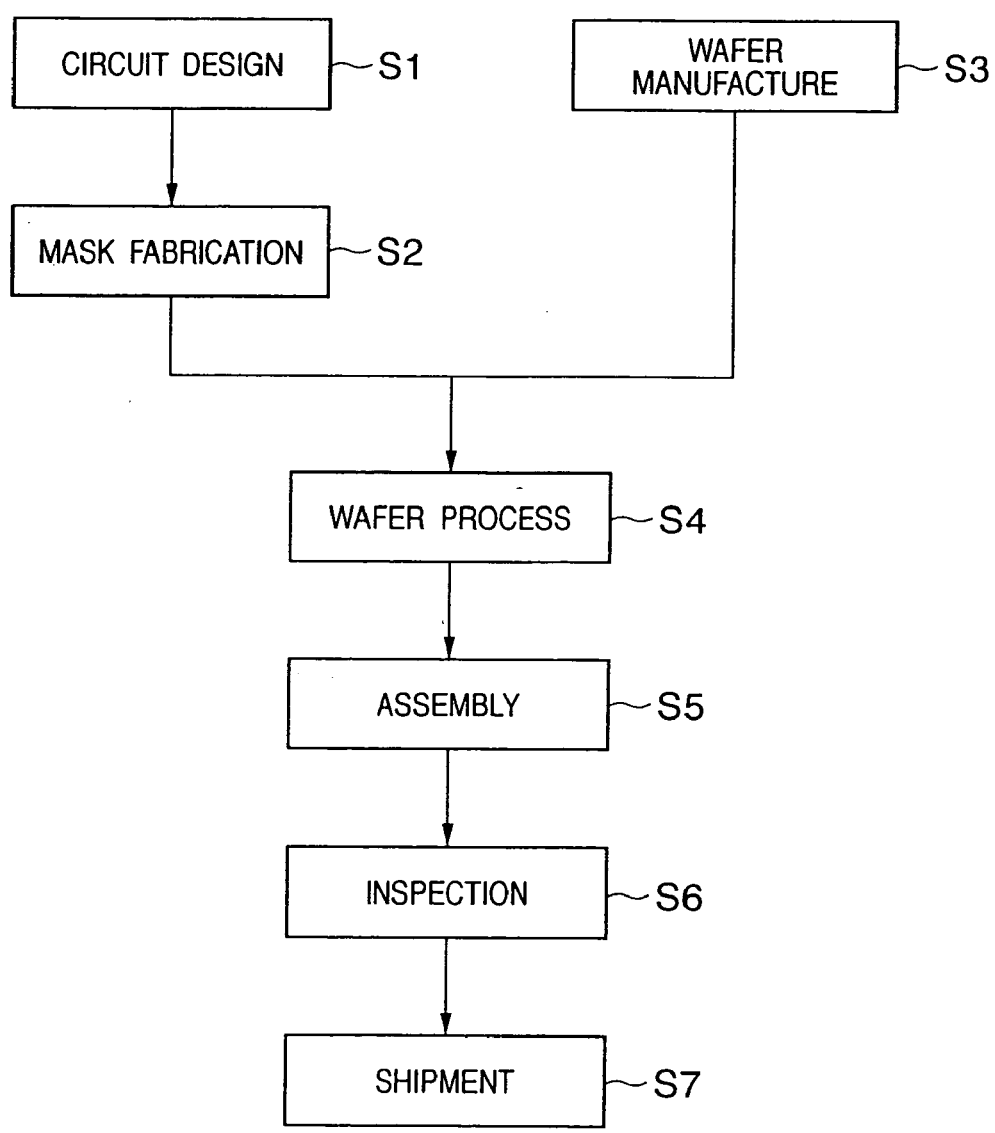
FIG. 14 is a flowchart showing the flow of an entire semiconductor device manufacturing process.

A semiconductor device manufacturing process using the above exposure apparatus will be described. FIG. 14 is a flowchart showing the flow of the entire semiconductor device manufacturing process. In step 1 (circuit design), the circuit of a semiconductor device is designed. In step 2 (mask fabrication), a mask is fabricated on the basis of the designed circuit pattern. In step 3 (wafer manufacture), a wafer is manufactured using a material such as silicon. In step 4 (wafer process), called a preprocess, an actual circuit is formed on the wafer in accordance with lithography using the mask and wafer described above. In the next step, step 5 (assembly), called a post-process, a semiconductor chip is formed from the wafer fabricated in step 4. This step includes processes such as assembly (dicing and bonding) and packaging (chip encapsulation). In step 6 (inspection), inspections, such as an operation check test and a durability test of the semiconductor device fabricated in step 5, are performed. A semiconductor device is finished with these steps and shipped (step 7).

Figure 15:
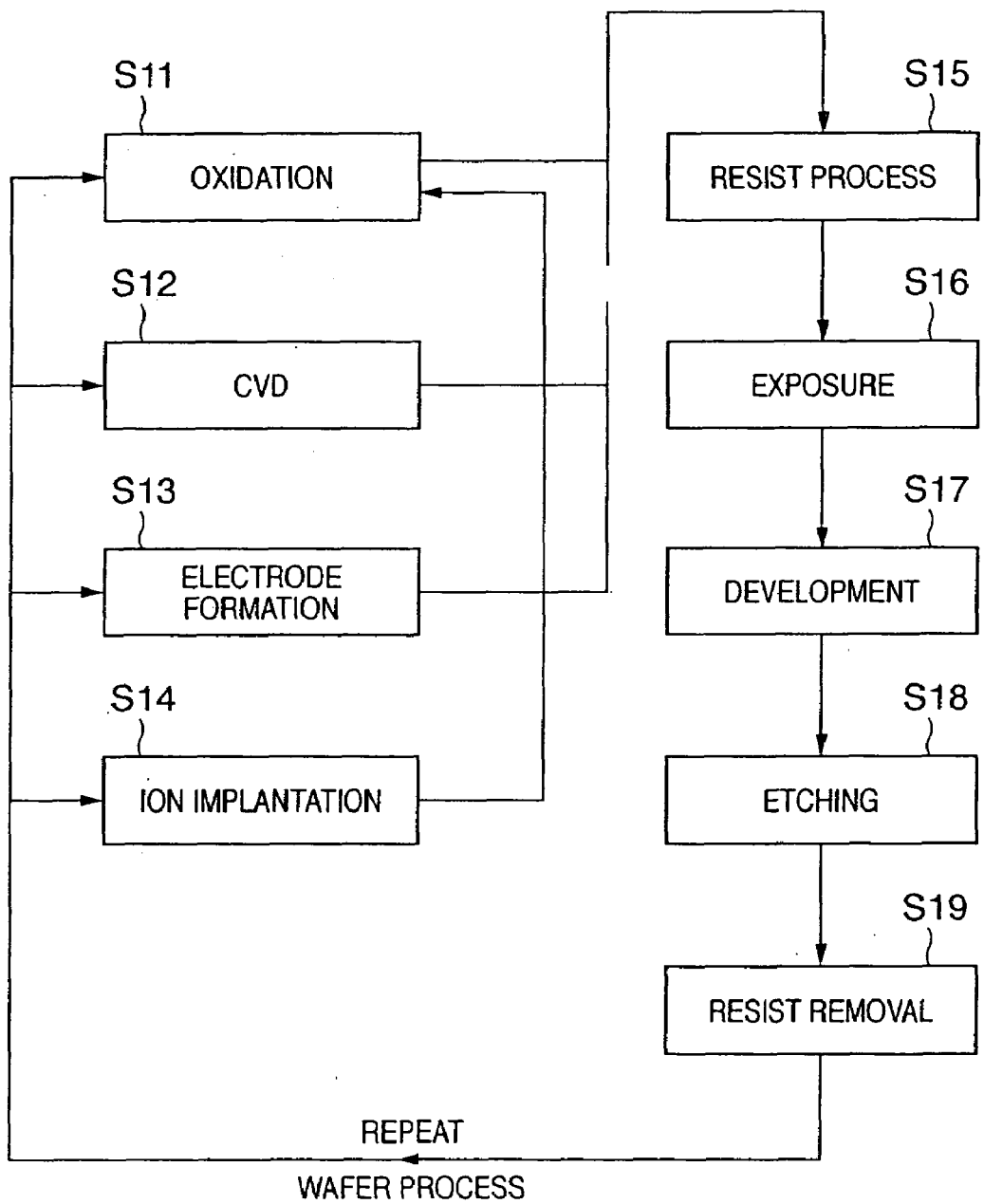
FIG. 15 is a flowchart showing the detailed flow of the wafer process.

FIG. 15 is a flowchart showing the detailed flow of the wafer process. In step 11 (oxidation), the surface of the wafer is oxidized. In step 12 (CVD), an insulating film is formed on the wafer surface. In step 13 (electrode formation), an electrode is formed on the wafer by deposition. In step 14 (ion implantation), ions are implanted in the wafer. In step 15 (resist process), a photosensitive agent is applied to the wafer. In step 16 (exposure), the circuit pattern is transferred to the wafer by the exposure apparatus described above. In step 17 (development), the exposed wafer is developed. In step 18 (etching), portions other than the developed resist image are removed. In step 19 (resist removal), any unnecessary resist after etching is removed. These steps are repeated to form multiple circuit patterns on the wafer.

As many apparently widely different embodiments of the present invention can be made without departing from the spirit and scope thereof, it is to be understood that the invention is not limited to the specific embodiments thereof except as defined in the claims.

CLAIM OF PRIORITY

This application claims priority from Japanese Patent Application No. 2004-128802 filed on Apr. 23, 2004, the entire contents of which are hereby incorporated by reference herein.

What is claimed is:

1. An exposure apparatus comprising:
an original stage arranged to hold a reflective original having a pattern;
a substrate stage arranged to hold a substrate;
an illumination optical system arranged to emit exposure light along a first direction inclined from a direction of a reflection surface of the reflective original;
a projection optical system arranged to project the pattern onto the substrate along a second direction using the exposure light reflected by the reflection surface of the reflective original;
an original reference member arranged on said original stage or the reflective original;
a substrate reference member, having a substrate mark, arranged on said substrate stage or the substrate; and
a detector arranged to detect measuring light from the substrate mark of said substrate reference member, which is illuminated with the measuring light, the measuring light illuminating said substrate reference member being emitted to said original reference member along the first direction, reflected by said original reference member, and passing through said projection optical system along the second direction,
wherein said original stage moves along the first direction and said substrate stage moves along a third direction substantially perpendicular to the second direction, associated with a detecting operation by said detector, and
wherein a focal point of said projection optical system is obtained based on a change in a detection signal of said detector in accordance with movement of said original stage in the first direction and movement of said substrate stage in the third direction.

2. The apparatus according to claim 1, wherein said exposure light is extreme ultraviolet light.

3. The apparatus according to claim 1, wherein said original stage and said substrate stage are positioned with respect to said projection optical system based on the obtained focal point of said projection optical system, and then the substrate is exposed to the pattern of the reflective original.

4. The apparatus according to claim 1, wherein said detector is arranged to detect a contrast of an image of the substrate mark.

5. The apparatus according to claim 4, wherein the substrate mark has a size defined based upon a field of view of said detector.

6. The apparatus according to claim 1, wherein said original reference member has an original mark and said detector detects an amount of the measuring light incident on said detector via said original mark and said substrate mark.

7. The apparatus according to claim 6, wherein said substrate stage is scanned along the third direction associated with the detecting operation by said detector.

8. The apparatus according to claim 1, wherein said detector is arranged above said substrate reference member so as to detect the measuring light reflected by the substrate mark of said substrate reference member.

9. The apparatus according to claim 1, wherein said detector is arranged below said substrate reference member so as to detect the measuring light passing through the substrate mark of said substrate reference member.

10. A method performed in an exposure apparatus comprising an original stage arranged to hold a reflective original having a pattern, a substrate stage arranged to hold a substrate, an illumination optical system arranged to emit exposure light along a first direction inclined from a direction of a reflection surface of the reflective original, a projection optical system arranged to project the pattern onto the substrate along a second direction using the exposure light reflected by the reflection surface of the reflective original, an original reference member arranged on the original stage or the reflective original, a substrate reference member, having a substrate mark, arranged on the substrate stage or the substrate, and a detector arranged to detect measuring light from the substrate mark of the substrate reference member, which is illuminated with the measuring light, the measuring light illuminating the substrate reference member being emitted to the original reference member along the first direction, reflected by the original reference member, and passing through the projection optical system along the second direction, the method comprising:

a moving step of moving the original stage along the first direction and moving the substrate stage along a third direction substantially perpendicular to the second direction;

a detecting step of detecting, by the detector, light from the substrate mark of the substrate reference member; and an obtaining step of obtaining a focal point of the projection optical system based on a change in a detection signal of the detector in accordance with movement of the original stage in the first direction and movement of the substrate stage in the third direction.

11. A method of manufacturing a device, the method comprising steps of:

exposing a substrate to radiation using an exposure apparatus;

developing the exposed substrate; and processing the developed substrate to manufacture the device, wherein the exposure apparatus comprises:

(i) an original stage arranged to hold a reflective original having a pattern;

(ii) a substrate stage arranged to hold the substrate;

(iii) an illumination optical system arranged to emit exposure light along a first direction inclined from a direction of a reflection surface of the reflective original;

(iv) a projection optical system arranged to project the pattern onto the substrate along a second direction using the exposure light reflected by the reflection surface of the reflective original;

(v) an original reference member arranged on the original stage or the reflective original;

(vi) a substrate reference member, having a substrate mark, arranged on the substrate stage or the substrate; and (vii) a detector arranged to measure detect light from the substrate mark of the substrate reference member, which is illuminated with the measuring light, the measuring light illuminating the substrate reference member being emitted to the original reference member along the first direction, reflected by the original reference member, and passing through the projection optical system along the second direction, wherein the original stage moves along the first direction and the substrate stage moves along a third direction substantially perpendicular to the second direction, associated with a detecting operation by the detector; and wherein a focal point of the projection optical system is obtained based on a change in a detection signal of the detector in accordance with movement of the original stage in the first direction and movement of the substrate stage in the third direction.

* * * * *

UNITED STATES PATENT AND TRADEMARK OFFICE
CERTIFICATE OF CORRECTION

PATENT NO. : 7,315,348 B2 Page 1 of 1
APPLICATION NO. : 11/110735
DATED : January 1, 2008
INVENTOR(S) : Shinichiro Koga It is certified that error appears in the above-identified patent and that said Letters Patent is hereby corrected as shown below:

COLUMN 9:
    Line 62, "AXM" should read -- AXR --.

COLUMN 10:
    Line 7, "AXM" should read -- AXW --.
    Line 11, "AXM" should read -- AXW --.
    Line 15, "AXM" should read -- AXW --.
    Line 39, "AXM" should read -- AXW --.

Signed and Sealed this

Twenty-second Day of July, 2008

JON W. DUDAS
*Director of the United States Patent and Trademark Office*